US012757716B2

(12) United States Patent
Lanzillo et al.

(10) Patent No.: US 12,757,716 B2
(45) Date of Patent: Oct. 6, 2026

(54) SINGLE BACKSIDE POWER PLANE FOR IMPROVED POWER DELIVERY

(71) Applicant: INTERNATIONAL BUSINESS MACHINES CORPORATION, Armonk, NY (US)

(72) Inventors: Nicholas Anthony Lanzillo, Wynantskill, NY (US); Huai Huang, Clifton Park, NY (US); Ruilong Xie, Niskayuna, NY (US); Hosadurga Shobha, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 678 days.

(21) Appl. No.: 17/931,145

(22) Filed: Sep. 12, 2022

(65) Prior Publication Data

US 2024/0088036 A1 Mar. 14, 2024

(51) Int. Cl.

| | |
|---|---|
| ***H10W 20/41*** | (2026.01) |
| ***H10W 20/00*** | (2026.01) |
| ***H10W 20/40*** | (2026.01) |
| ***H10W 72/20*** | (2026.01) |

(52) U.S. Cl.

CPC ....... *H10W 20/427* (2026.01); *H10W 20/056* (2026.01); *H10W 20/496* (2026.01); *H10W 72/234* (2026.01); *H10W 72/244* (2026.01)

(58) Field of Classification Search

CPC ........... H01L 21/76877; H01L 23/5223; H01L 23/5226; H01L 23/528; H01L 23/5286; H01L 24/05; H01L 21/76802; H01L 21/76898; H10W 20/023; H10W 20/427; H10W 20/496; H10W 72/29; H10W 72/90

See application file for complete search history.

(56) References Cited

U.S. PATENT DOCUMENTS 6,355,950 B1 * 3/2002 Livengood .......... H01L 23/5286 257/E21.597
9,531,052 B2 12/2016 Dang
10,607,938 B1 * 3/2020 Rubin ............... H01L 21/76802
10,636,739 B2 4/2020 Beyne (Continued)

OTHER PUBLICATIONS

Chen et al., "Design and Optimization of SRAM Macro and Logic Using Backside Interconnects at 2nm node", © 2021 IEEE, IEDM21-498, pp. 22.4.1-22.4.4.

(Continued)

*Primary Examiner* — Wael M Fahmy
*Assistant Examiner* — Shamita S Hanumasagar
(74) *Attorney, Agent, or Firm* — Samuel A. Waldbaum

(57) ABSTRACT

A microelectronic structure including a plurality of electronic devices. A plurality of frontside contacts, where each of the plurality of frontside contacts is connected to a frontside of one of the plurality electronic devices, respectively. Each of the plurality of frontside contacts is a same first electric potential. A plurality of backside contacts, where the plurality of backside contacts is connected to a backside of one of the plurality of electronic devices, respectively. Each of the plurality of backside contacts is a same second electrical potential, where the first electrical potential is different than the second electrical potential.

16 Claims, 4 Drawing Sheets

(56) References Cited

U.S. PATENT DOCUMENTS

| | | | | |
|---|---|---|---|---|
| 10,950,550 | B2 | 3/2021 | Qian | |
| 11,031,296 | B2 | 6/2021 | Anderson | |
| 11,133,259 | B2 | 9/2021 | Rubin | |
| 11,257,764 | B2 | 2/2022 | Hiblot | |
| 2007/0035014 | A1 * | 2/2007 | Fung | H05K 1/0231 257/723 |
| 2013/0181221 | A1 * | 7/2013 | Kaneko | H03K 19/00 438/158 |
| 2017/0118844 | A1 * | 4/2017 | Chamberlin | H05K 1/184 |
| 2017/0263470 | A1 | 9/2017 | Lin | |
| 2018/0218973 | A1 | 8/2018 | Nelson | |
| 2020/0304112 | A1 * | 9/2020 | Zhang | H02H 1/0007 |
| 2020/0373242 | A1 | 11/2020 | Hiblot | |
| 2020/0411507 | A1 * | 12/2020 | An | H10B 99/22 |
| 2021/0111115 | A1 | 4/2021 | Patrick | |
| 2021/0202472 | A1 | 7/2021 | Thomson | |
| 2022/0037306 | A1 | 2/2022 | You | |

OTHER PUBLICATIONS

Kim, "Optimal Power Delivery Strategy in Modern VLSI Design", Doctoral Dissertation, Department of Electrical Engineering, Graduate School of UNIST, Jun. 18, 2019, 121 pages.

Kommera et al., "Novel Multi-Layer Through-Die Connections for Package to Chip Power and Ground Connections", 2003 Electronic Components and Technology Conference, IEEE, pp. 620-626.

Xu, "Power Delivery in High Current 3-D Systems", Requirements for the Degree Doctor of Philosophy, University of Rochester, Rochester, New York, 2020, 324 pages.

* cited by examiner

SINGLE BACKSIDE POWER PLANE FOR IMPROVED POWER DELIVERY

BACKGROUND

The present invention generally relates to the field of microelectronic, and more particularly to a formation of a single backside power plane for improved power delivery.

Nanosheet is the lead device architecture in continuing CMOS scaling. However, nanosheet technology has shown issues when scaling down such that as the devices become smaller and closer together, they are interfering with each other. Delivering power to the devices in an efficient manner is becoming more difficult to achieve.

BRIEF SUMMARY

Additional aspects and/or advantages will be set forth in part in the description which follows and, in part, will be apparent from the description, or may be learned by practice of the invention.

A microelectronic structure including a plurality of electronic devices. A plurality of frontside contacts, where each of the plurality of frontside contacts is connected to a frontside of one of the plurality electronic devices, respectively. Each of the plurality of frontside contacts is a same first electric potential. A plurality of backside contacts, where the plurality of backside contacts is connected to a backside of one of the plurality of electronic devices, respectively. Each of the plurality of backside contacts is a same second electrical potential, where the first electrical potential is different than the second electrical potential.

A microelectronic structure including a plurality of electronic devices and a plurality of frontside contacts. Each of the plurality of frontside contacts is connected to a frontside of one of the plurality electronic devices, respectively, where the each of the plurality of frontside contacts is a same first electric potential. A plurality of backside contacts, where the plurality of backside contacts is connected to a backside of one of the plurality of electronic devices, respectively. Each of the plurality of backside contacts is a same second electrical potential, where the first electrical potential is different than the second electrical potential. A backside power plane connected to each of the plurality of backside contacts, where the backside power plane and the plurality of backside contacts are formed of a single continuous metal layer comprised of same metal material.

A method including the steps of forming a plurality of electronic devices. Forming a plurality of frontside contacts, where each of the plurality of frontside contacts is connected to a frontside of one of the plurality electronic devices, respectively. Each of the plurality of frontside contacts is a same first electric potential. Forming a plurality of backside contacts, where the plurality of backside contacts is connected to a backside of one of the plurality of electronic devices, respectively. Each of the plurality of backside contacts is a same second electrical potential, where the first electrical potential is different than the second electrical potential. Forming a backside power plane connected to each of the plurality of backside contacts, where the backside power plane and the plurality of backside contacts are formed of a single continuous metal layer comprised of same metal material. The backside power plane and the plurality of backside contacts are formed simultaneously during the same metallization process.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 2:
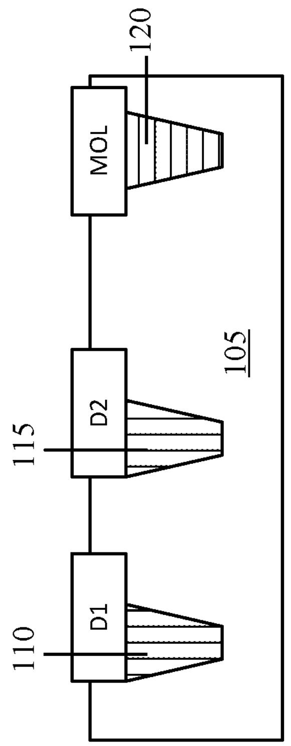
FIG. 2 illustrates the processing stage after the formation of a plurality of devices and Middle of the line components, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms “a,” “an,” and “the” include plural referents unless the context clearly dictates otherwise. Thus, for example, reference to “a component surface” includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to “one embodiment,” “an embodiment,” an example embodiment,” etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms “upper,” “lower,” “right,” “left,” “vertical,” “horizontal,” “top,” “bottom,” and derivatives thereof shall relate to the disclosed structures and methods, as orientated in the drawing figures. The terms “overlying,” “atop,” “on top,” “positioned on,” or “positioned atop” mean that a first element, such as a first structure, is present on a second element, such as a second structure, where intervening elements, such as an interface structure may be present between the first element and the second element. The term “direct contact” means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer “A” over layer “B” includes situations in which one or more intermediate layers (e.g., layer “C”) is between layer “A” and layer “B” as long as the relevant characteristics and functionalities of layer “A” and layer “B” are not substantially changed by the intermediate layer(s).

The following definitions and abbreviations are to be used for the interpretation of the claims and the specification. As used herein, the terms “comprises,” “comprising,” “includes,” “including,” “has,” “having,” “contains,” or “containing” or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term “exemplary” is used herein to mean “serving as an example, instance or illustration.” Any embodiment or design described herein as “exemplary” is not necessarily to be construed as preferred or advantageous over other embodiment or designs. The terms “at least one” and “one or more” can be understood to include any integer number greater than or equal to one, i.e., one, two, three, four, etc. The terms “a plurality” can be understood to include any integer number greater than or equal to two, i.e., two, three, four, five, etc. The term “connection” can include both indirect “connection” and a direct “connection.”

As used herein, the term “about” modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms “about” or “substantially” are intended to include the degree of error associated with measurement of the particular quantity based upon the equipment available at the time of the filing of the application. For example, about can include a range of ±8%, or 5%, or 2% of a given value. In another aspect, the term “about” means within 5% of the reported numerical value. In another aspect, the term “about” means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards delivering power to devices in an efficient manner, such that a frontside deliver network makes a VDD or VSS electrical potential connection only to the top side of the devices. The backside power plane makes a VDD or VSS electrical potential connection only (the connection opposite to the frontside connection) to the backside of the devices. The backside power plane is only making one type of power connection using a single metal plane to make that connection. The present invention allows for fewer metal layers to be used in the back side power scheme (i.e., a single metal plane) to make the power connection, thus saving money from the manufacturing of the device. Furthermore, by using one metal layer or backside power plane improves the resistance drop, reduces power supply noise, and improves the performance of the devices. Since the frontside power connection is providing only one type of one potential source the frontside power scheme does not require as much space (i.e., signal lines or other metal lines) which free up more space to be made available for other components, for example, increasing the signal line width, which would reduce delay and improve performance. By separating the VDD and VSS (i.e., only one on the frontside and one on the backside) frees up a significant number of lines that can be used for signals which is dependent on the chip design. The percentage of lines freed up can be in the range of 5 to 25% dependent on the chip design.

Figure 1:
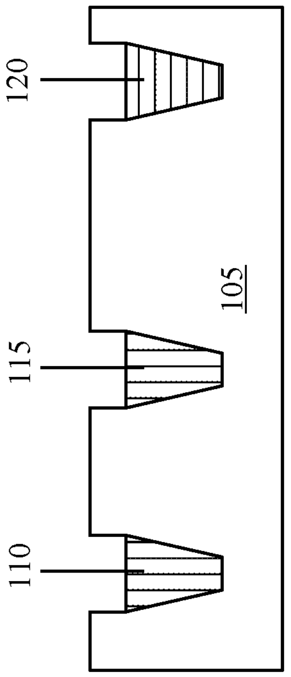
FIG. 1 illustrates the processing stage after the formation of backside contacts, in accordance with the embodiment of the present invention.

FIGS. 1 to 5 illustrate the processing stages of forming the backside device contacts, devices, middle of the line (MOL) components, frontside device contacts, front side power components, and the backside power plane. FIG. 1 illustrates a plurality of backside contacts 110, 115, and 120 are formed in a first layer 105. The first layer 105 can be a substrate or any other suitable layer material, for example, shallow trench isolation material, an interlayer dielectric material, etc. A first backside contact 110 and a second backside contact 115 will both be either a VSS contact or a VDD contact. For illustrative purposes only the first backside contact 110 and the second backside contact 115 will be VSS contacts. The first backside contact 110 and the second backside contact 115 are formed in the logic region of the device and the third backside contact 120 is formed in a non-logic region 147. The third backside contact 120 can be either a VSS or VDD contact. FIG. 2 illustrates the formation of a first device D1, a second device D2, and the middle-of-the-line MOL components. The first device D1 is located on top of the first backside contact 110, the second device D2 is located on top of the second backside contact 115, and the MOL components are located on top of the third backside contact 120. The first device D1 and the second device D2, can be transistors, MRAM, or other electronic devices that require power.

Figure 3:
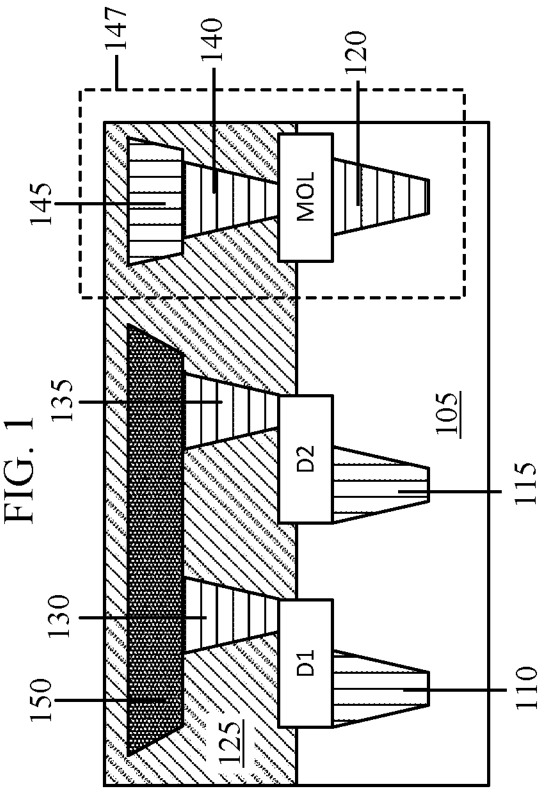
FIG. 3 illustrates the processing stage after the formation of frontside contacts, in accordance with the embodiment of the present invention.

FIG. 3 illustrates the formation of a frontside interlayer dielectric layer 125, a first frontside contact 130, a second frontside contact 135, a third frontside contact 140, a back-end-of-the-line (BEOL) layer 150, and an island 145. The frontside interlayer dielectric layer 125 is located on top of the first layer 105, the first device D1, the second device D2, and the MOL components. A plurality of trenches (not shown) is formed in the frontside interlayer dielectric layer 125 to allow for the formation of the frontside contacts. The trenches are filled with a metal material to form a first frontside contact 130, a second frontside contact 135, and a third frontside contact 140. As stated above the first backside contact 110 and the second backside contact 115 will be VSS contacts, then the first and second frontside contacts 130, 135 will be the opposite charge. This means that the first frontside contact 130 and the second frontside contact 135 will be VDD contacts. Alternatively, if the first backside contact 110 and the second backside contact 115 are VDD contacts, then the first frontside contact 130 an the second frontside contact 135 will be VSS contacts. The third frontside contact 140 is formed in the non-logic region 147, such that the third frontside contact 140 is in contact with the MOL components. The BEOL layer 150 are formed on top of the first frontside contact 130 and the second frontside contact 135, and the BEOL layer 150 is surrounded by additional frontside interlayer dielectric layer 125 material. An island 145 is formed on top of the third contact 140, where the island 145 is a VSS island.

Figure 4:
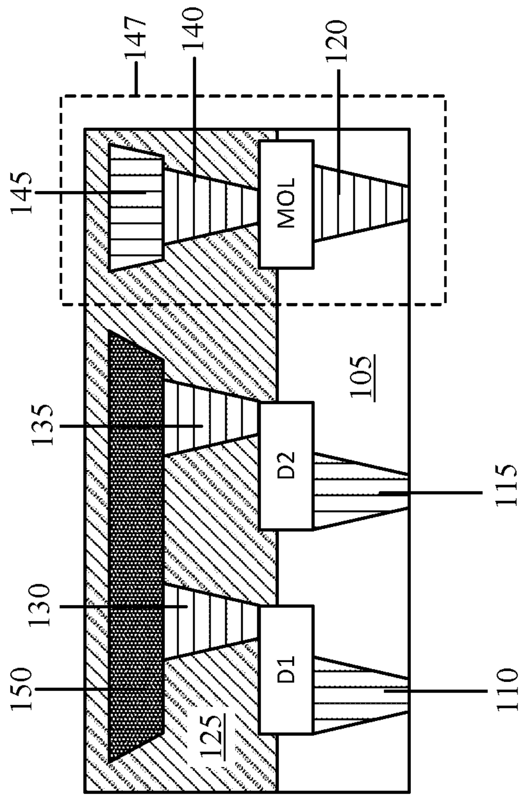
FIG. 4 illustrates the processing stage after the exposing a surface of the backside contacts, in accordance with the embodiment of the present invention.
Figure 5:
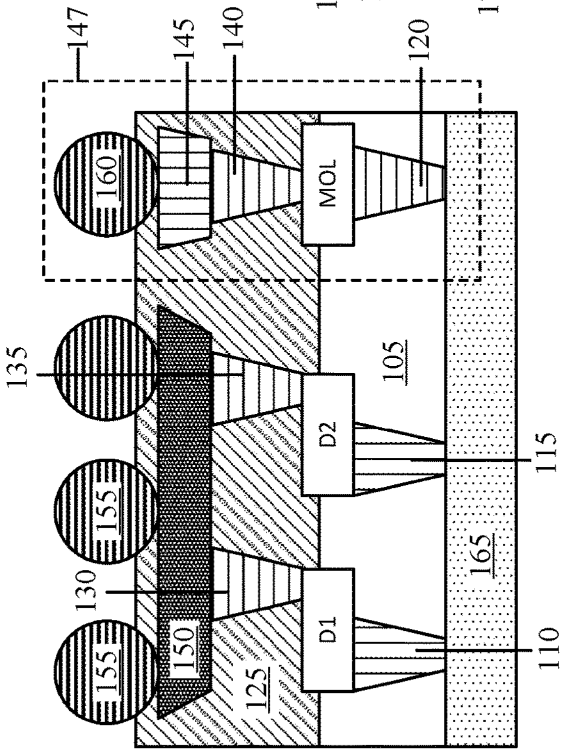
FIG. 5 illustrates the processing stage after the formation of a backside power plane and frontside microdots, in accordance with the embodiment of the present invention.

FIG. 4 illustrates the processing of the backside to expose a surface of the first backside contact 110, the second backside contact 115, and the third backside contact 120. The first layer 105 is etched, ground, or another suitable means to remove material, to expose a backside surface of each of the first backside contact 110, the second backside contact 115, and the third backside contact 120. FIG. 5 illustrates the formation of the backside power plane 165. The backside power plane 165 is comprised of a single metal layer, which is formed in one processing step. The backside power plane 165 is in contact with the exposed backside surface of the first backside contact 110, the second backside contact 115, and the third backside contact 120. By separating the VSS contacts and the VDD contacts (i.e., having only VSS on the backside and VDD on the frontside, or having only VSS on the frontside and VDD on the backside) allows for the formation of the single metal layer backside power plane 165.

Typically, the backside power distribution network (BSPDN) is formed of multiple layers to allow for forming VSS and VDD contacts. The present invention avoids the need for the typical BSPDN layer by separating the VSS and the VDD contacts between the frontside and the backside of the device. The present invention allows for the formation of a single backside power plane 165, thus the present invention is reducing the cost of manufacturing by reducing the number of metal layers located on the backside of the chip. Furthermore, the single backside power plane 165 has improved resistance drop, reduced noise, and improved performance when compared to the typical BSPDN layer.

A plurality of microdots 155 and 160 are formed on the frontside of the chip. The microdots 155 are located in the logic region and the microdots 160 are located in the non-logic region 147. FIG. 5 shows a single level of front side interconnect wiring (BEOL 150) which have the microdots 155 connecting directly to them. FIG. 5 is a simplistic view of the invention and the BEOL 150 would be multiple levels of interconnect wiring are not shown.

Figure 6:
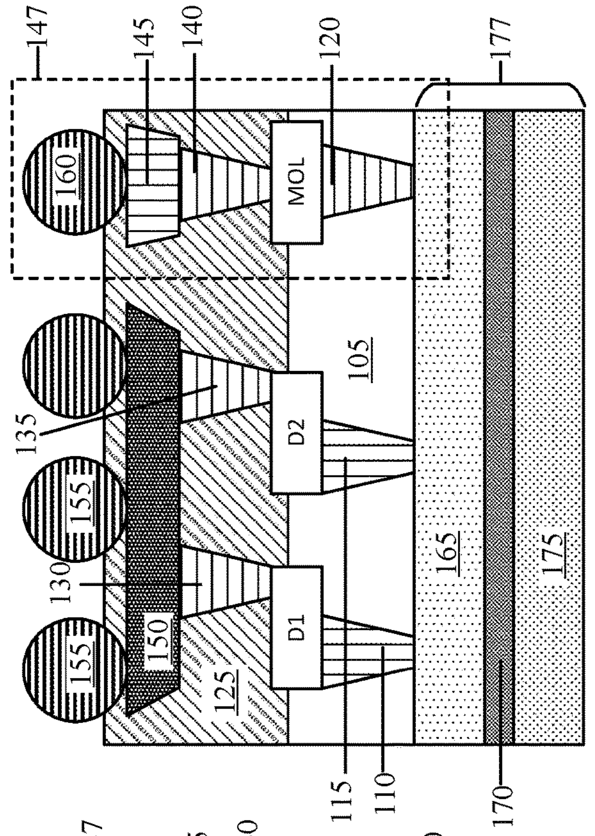
FIG. 6 illustrates the processing stage after the formation of a backside power plane, a backside MIM structure, and a frontside microdots, in accordance with the embodiment of the present invention.

FIG. 6 illustrates the processing stage after the formation of a metal-insulator-metal (MIM) 177 on the backside of the chip. The first metal layer of the MIM 177 is the backside power plane 165. An insulator layer 170 is formed on the backside power plane 165 and a second metal layer 175 is formed on the insulator layer 170. The MIM 177 can be formed because the backside power plane 165 is comprised of a single metal layer instead of multiple layers.

Figure 7:
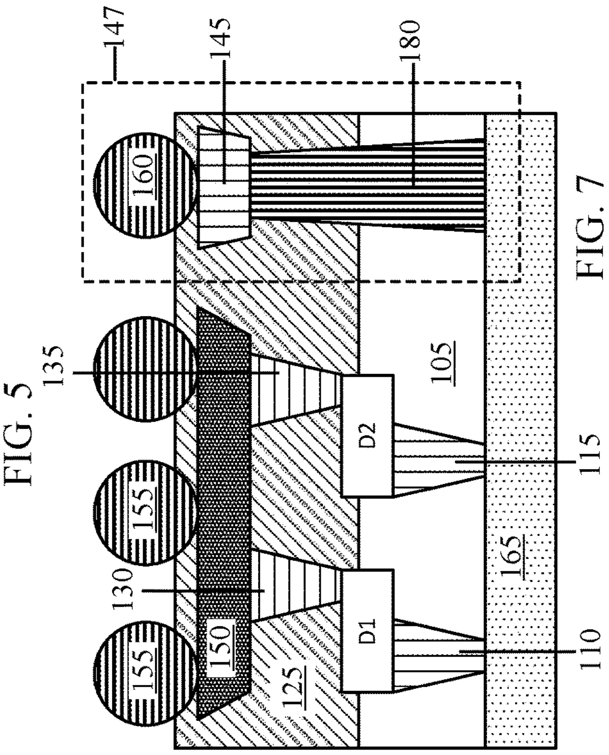
FIG. 7 illustrates the processing stage after the formation of a backside power plane, a skip via, and frontside microdots, in accordance with the embodiment of the present invention.
Figure 8:
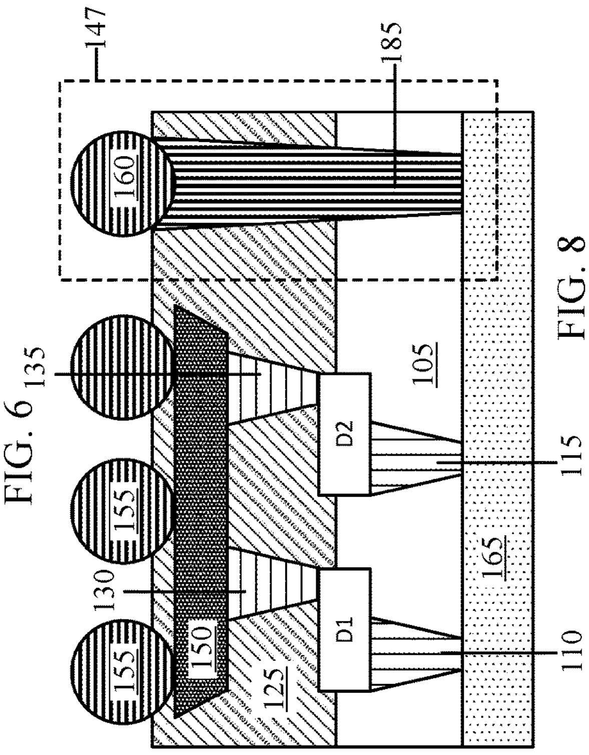
FIG. 8 illustrates the processing stage after the formation of a backside power plane, a skip via, and frontside microdots, in accordance with the embodiment of the present invention.

FIG. 7 illustrates an alternative design wherein the third backside contact 120, the MOL layer, and the third frontside contact 140 are not formed. During the processing of the backside of the chip, a backside skip via trench (not shown) is formed in the first layer 105 and the frontside interlayer dielectric layer 125. The backside skip via trench exposes a backside surface of the island 145. During the metallization process to form the backside power plane 165, the backside skip via trench is filled in to form the skip via 180. This allows for a single metallization process to form the backside power plane 165 and the skip via 180 simultaneously. FIG. 8 illustrates an alternative design where the island 145, the frontside contact 140, the MOL, and the backside contact 120 located in the non-logic region 147 is replaced with a frontside skip via 185. After the formation of the backside power plane 165, a frontside skip via trench (not shown) is formed in the non-logic region 147. The frontside skip via trench is filled in with a metal to form the frontside skip via 185.

Figure 9:
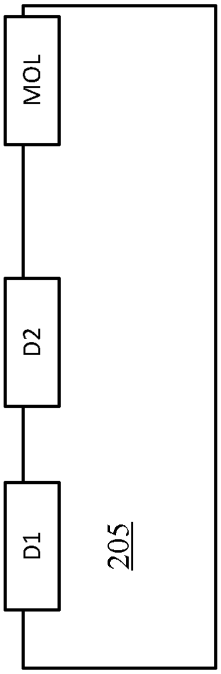
FIG. 9 illustrates the processing stage after the formation of a plurality of devices and Middle of the line components, in accordance with the embodiment of the present invention.

FIGS. 9 to 13 illustrate the processing stages of forming the backside device contacts, devices, middle of the line (MOL) components, frontside device contacts, front side power components, and the backside power plane. FIG. 9 illustrates the formation of a first device D1, a second device D2, and the middle-of-the-line MOL components in the first layer 205. The first layer 205 can be a substrate or any other suitable layer material, for example, shallow trench isolation material, interlayer dielectric material, etc.

Figure 10:
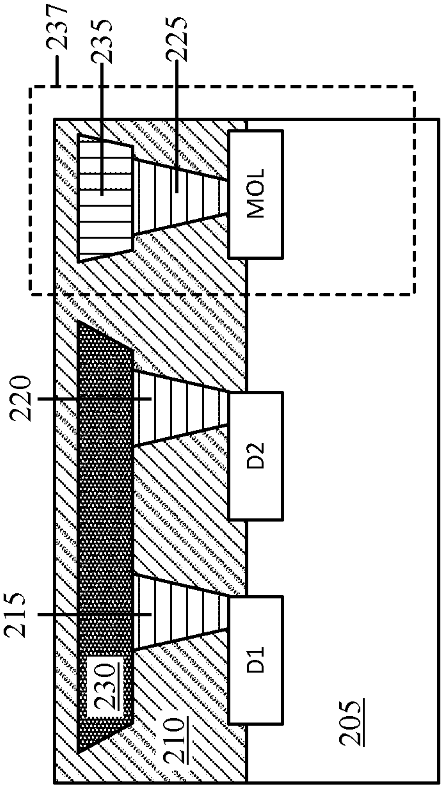
FIG. 10 illustrates the processing stage after the formation of frontside contacts, in accordance with the embodiment of the present invention.

FIG. 10 illustrates the formation a frontside interlayer dielectric layer 210, a first frontside contact 215, a second frontside contact 220, a third frontside contact 225, a back-end-of-the-line (BEOL) layer 230, and an island 235. The frontside interlayer dielectric layer 210 is located on top the first layer 205, the first device D1, the second device D2, and the MOL components. A plurality of trenches is formed in the frontside interlayer dielectric layer 210 to allow for the formation of the frontside contacts. The trenches are filled with a metal material to form a first frontside contact 215, a second frontside contact 220, and a third frontside contact 225. The first frontside contact 215 and the second frontside contact 220 will be VDD contacts, then the backside contacts will be VSS contacts. Alternatively, if the first frontside contact 215 and the second frontside contact 220 are VSS contacts, then the backside contacts will be VDD contacts. The third frontside contact 225 is formed in the non-logic region 237, such that the third frontside contact 225 is in contact with the MOL components. The BEOL layer 230 are formed on top of the first frontside contact 215 and the second frontside contact 220, and the BEOL layer 230 is surrounded by additional frontside interlayer dielectric layer 210 material. An island 235 is formed on top of the third contact 225, where the island 235 is a VSS island.

Figure 11:
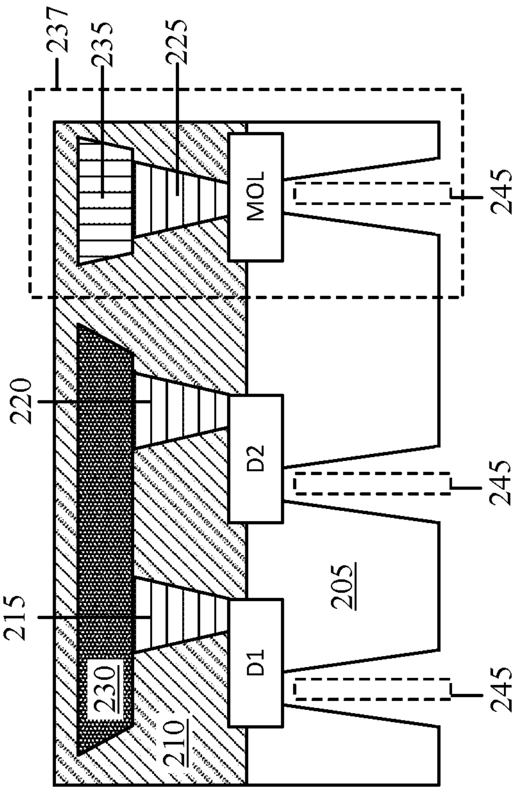
FIG. 11 illustrates the processing stage after the formation of backside contact trenches, in accordance with the embodiment of the present invention.
Figure 12:
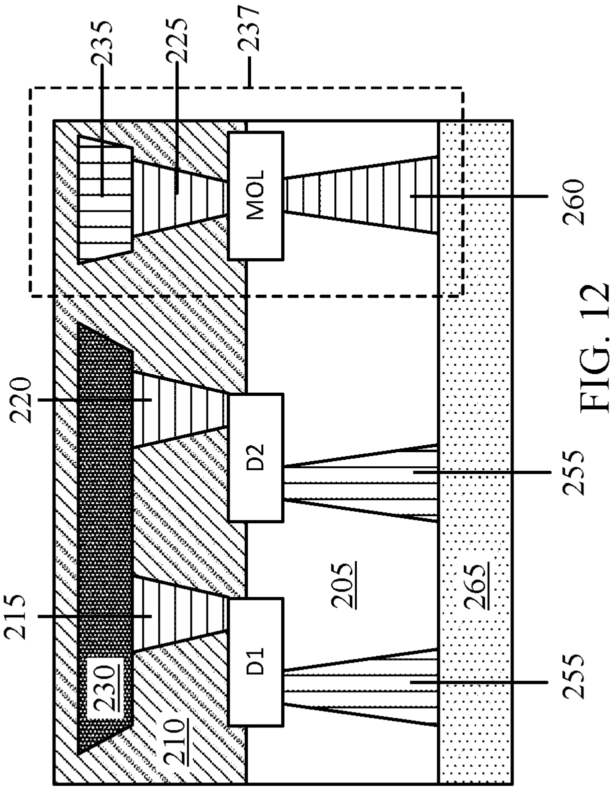
FIG. 12 illustrates the processing stage after the formation of a backside power plane, in accordance with the embodiment of the present invention.
Figure 13:
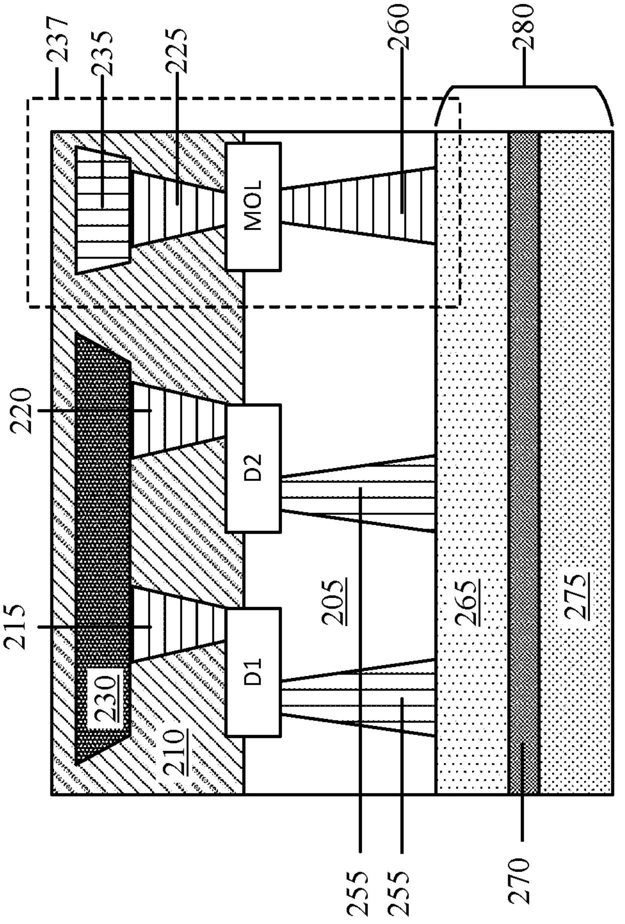
FIG. 13 illustrates the processing stage after the formation a backside MIM structure, in accordance with the embodiment of the present invention.

FIG. 11 illustrates the backside processing of the chip, where backside contact trenches 245 are formed in the first layer 205. The backside contact trenches 245 expose a backside surface of the first device D1, the second device D2, and the MOL components, respectively. As illustrated by FIG. 12, during the metallization process to form the backside power plane 265, the backside contact trenches 245 are filled in to form the backside contacts 255, 260. This allows for a single metallization process to form the backside power plane 265 and the backside contacts 255, 260 simultaneously. Thus, the backside power plane 265 will form a continuous metal layer (i.e., comprised of the same metal material) with the backside contacts 255, 260. The backside contacts 255 may be VSS contacts since the frontside contacts 215, 220 are VDD contacts. Alternatively, the backside contacts 255 may be VDD contacts when the frontside contacts 215, 220 are VSS contacts. The backside contact 260 is formed in the non-logic region 237 and connected to the MOL components. FIG. 13 illustrates a metal-insulator-metal (MIM) 280 on the backside of the chip. The first metal layer of the MIM 280 is the backside power plane 265. An insulator layer 270 is formed on the backside power plane 265 and a second metal layer 275 is formed on the insulator layer 270. The MIM 280 can be formed because the backside power plane 265 is comprised of a single metal layer.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:

a plurality of electronic devices, a plurality of frontside contacts, wherein each of the plurality of frontside contacts is connected to a frontside of one of the plurality electronic devices, respectively, wherein each of the plurality of frontside contacts is a same first electric potential, wherein each frontside contact of the plurality of frontside contacts is located on a first horizontal side of the one of the plurality of electronic devices that it is connected to, respectively;

a plurality of backside contacts, wherein each of the plurality of backside contacts is connected to a backside of one of the plurality of electronic devices, respectively, wherein each of the plurality of backside contacts is a same second electrical potential, wherein the first electrical potential is different than the second electrical potential, wherein each backside contact of the plurality of backside contacts is located on a second horizontal side of the one of the plurality of electronic devices that it is connected to, respectively, wherein the first horizontal side and the second horizontal side are located on opposite sides of the plurality of electronic devices; and a backside power plane connected to each of the plurality of backside contacts.

2. The microelectronic structure of claim 1, wherein the first electrical potential is a VSS electrical potential.

3. The microelectronic structure of claim 2, wherein the second electrical potential is a VDD electrical potential.

4. The microelectronic structure of claim 1, wherein the first electrical potential is a VDD electrical potential.

5. The microelectronic structure of claim 4, wherein the second electrical potential is a VSS electrical potential.

6. The microelectronic structure of claim 1, wherein the backside power plane is comprised of a single metal layer.

7. The microelectronic structure of claim 6, further comprising:

an insulator layer formed on a backside surface of the backside power plane.

8. The microelectronic structure of claim 7, further comprising:

a backside metal layer formed on a backside surface of the insulator layer, wherein the backside power plane, the insulator layer, and the backside metal layer form a metal-insulator-metal device.

9. A microelectronic structure comprising:

a plurality of electronic devices, a plurality of frontside contacts, wherein each of the plurality of frontside contacts is connected to a frontside of one of the plurality electronic devices, respectively, wherein each of the plurality of frontside contacts is a same first electric potential, wherein each frontside contacts of the plurality of frontside contacts is located on a first horizontal side of the one of the plurality of electronic devices;

a plurality of backside contacts, wherein each of the plurality of backside contacts is connected to a backside of one of the plurality of electronic devices, respectively, wherein each of the plurality of backside contacts is a same second electrical potential, wherein the first electrical potential is different than the second electrical potential, wherein each backside contact of the plurality of backside contacts is located on a second horizontal side of the one of the plurality of electronic devices, wherein the first horizontal side and the second horizontal side are located on opposite sides of the plurality of electronic devices; and a backside power plane connected to each of the plurality of backside contacts, wherein the backside power plane and the plurality of backside contacts are formed of a single continuous metal layer comprised of a same metal material, wherein the backside power plane is comprised of a single metal layer.

10. The microelectronic structure of claim 9, wherein the backside power plane is comprised of a single metal layer.

11. The microelectronic structure of claim 9, wherein the first electrical potential is a VSS electrical potential.

12. The microelectronic structure of claim 11, wherein the second electrical potential is a VDD electrical potential.

13. The microelectronic structure of claim 9, wherein the first electrical potential is a VDD electrical potential.

14. The microelectronic structure of claim 13, wherein the second electrical potential is a VSS electrical potential.

15. The microelectronic structure of claim 9, further comprising:

an insulator layer formed on a backside surface of the backside power plane.

16. The microelectronic structure of claim 15, further comprising:

a backside metal layer formed on a backside surface of the insulator layer, wherein the backside power plane, the insulator layer, and the backside metal layer form a metal-insulator-metal device.

* * * * *